United States Patent
De Haas et al.

(10) Patent No.: US 7,191,348 B2
(45) Date of Patent: Mar. 13, 2007

(54) TRANSITION DETECTION AT INPUT OF INTEGRATED CIRCUIT DEVICE

(75) Inventors: Clemens Gerhardus Johannes De Haas, Nijmegen (NL); Cecilius Gerardus Kwakernaat, Nijmegen (NL); Stefan Gerhard Erich Butselaar, Nijmegen (NL)

(73) Assignee: NXP B.V., Eindhoven (NL)

( * ) Notice: Subject to any disclaimer, the term of this patent is extended or adjusted under 35 U.S.C. 154(b) by 76 days.

(21) Appl. No.: 10/525,579

(22) PCT Filed: Jul. 22, 2003

(86) PCT No.: PCT/IB03/03192

§ 371 (c)(1),
(2), (4) Date: Feb. 23, 2005

(87) PCT Pub. No.: WO2004/021539

PCT Pub. Date: Mar. 11, 2004

(65) Prior Publication Data

US 2005/0246555 A1    Nov. 3, 2005

(30) Foreign Application Priority Data

Aug. 30, 2002    (EP)    ................... 02078581

(51) Int. Cl.
*G06F 1/26* (2006.01)
(52) U.S. Cl. ............... 713/320; 713/321; 713/322; 713/323; 713/324; 315/80; 315/84; 324/415; 324/416
(58) Field of Classification Search ........ 713/320–324; 315/80, 84; 324/415–416

See application file for complete search history.

(56) References Cited

U.S. PATENT DOCUMENTS

| 5,794,055 | A | 8/1998 | Langer et al. .......... 395/750.01 |
| 6,023,108 | A * | 2/2000 | Lenhard .................... 307/10.1 |
| 6,534,990 | B2 * | 3/2003 | Hocken et al. ............. 324/416 |
| 6,580,219 | B1 * | 6/2003 | Jones et al. ................. 315/80 |
| 6,735,705 | B1 * | 5/2004 | Egbert et al. ............... 713/300 |
| 7,080,270 | B2 * | 7/2006 | Yokozeki et al. ........... 713/320 |

* cited by examiner

*Primary Examiner*—A. Elamin
(74) *Attorney, Agent, or Firm*—Bill Francos; Kevin H. Fortin

(57) ABSTRACT

An integrated circuit has an input connection for connecting an external signal conductor that passes signals to execute functions in the device. The external signal conductor can pick up strong interfering signals with high frequency content, for example when the device is used in a car. To protect against unintended execution of functions the device contains a timer circuit comprising a capacitance and a current supplying circuit coupled to an integration node. A discharge diode is coupled between the input connection and the integration node, with a polarity such that the discharge diode, when in forward bias, is capable of draining current from the current supplying circuit. A detector is coupled to the integration node for generating a signal to be supplied to the integrated circuit device to respond to a signal transition on the conductor. The diode serves to reset integration on the integration node before the detector detects the transition in case of short pulses. By using a diode instead of a switching transistor the circuit is more robust against the effect of interfering pulses.

6 Claims, 3 Drawing Sheets

TRANSITION DETECTION AT INPUT OF INTEGRATED CIRCUIT DEVICE

The invention relates to an integrated circuit device and more particularly to the detection of signals at an input of such a device.

An integrated circuit device has to receive input signals from circuits outside the integrated circuit device. These outside circuits are connected to the integrated circuit device via relatively long conducting wires. In some cases the integrated circuit device has to operate in very hostile circuit environments, where the conducting wires can pick-up strong unwanted signal pulses. In cars for example (more generally in automotive environments) unwanted signal pulses can have a bandwidth of 1 GHz or more and amplitudes of tens of volts. In such a hostile environment the unwanted pulses are difficult to suppress, because they have a tendency to penetrate the circuit in an uncontrolled way via parasitic pathways.

The unwanted signal pulses can be distinguished from normal signals on the conductor on the basis of duration. Only signals with pulses that last longer than all or most of the pulses of the unwanted signal are used as normal signals. To eliminate unwanted pulses on the basis of duration, passive linear low-pass filters may be used which are made up of resistors and capacitors to filter out unwanted signal pulses. However, passive linear low-pass filters that use resistors and capacitors to filter out pulses require relatively large capacitors. When integrated in an integrated circuit such capacitors take up valuable space in the integrated circuit.

U.S. Pat. No. 5,794,055 shows an alternative approach in a circuit for use in an automotive environment where an external wake-up signal is used to trigger an interrupt to a microprocessor circuit in an integrated circuit device. The wake-up signal is generated by closing a switch that is connected to an input connection of the circuit. To suppress noise, the wake-up signal is not converted to an interrupt signal immediately after detection of an input signal that corresponds to closing of the switch. Rather, with a delay after detection of the input signal, the circuit starts applying a diagnostic current to the input connection. The interrupt is applied to the microprocessor only if the response to the diagnostic current confirms that the switch is closed.

For its normal signal operation, excepting noise suppression, U.S. Pat. No. 5,794,055 describes various circuits with resistors and capacitors, for example, a signal conditioner circuit with a low-pass filter and voltage divider function. The input of this conditioner circuit is coupled to the switch via a blocking diode, which comes into conduction when the switch is closed to indicate a wake-up signal. The conditioner circuit acts as a low-pass filter and voltage divider of the signal generated by closing the switch before that signal is applied to an input of a microcontroller. The blocking diode prevents any influence via the input that is connected to the switch when the switch is not closed.

When integrated in an integrated circuit, passive linear low-pass filters that use resistors and capacitors to filter out pulses require relatively large capacitors and/or resistors. An alternative technique to filter out pulses uses a timer circuit. FIG. 1 shows a conventional timer circuit applied to detect an input signal. In the timer circuit the signal at the input connection 10 is used to start and reset integration in an integrating circuit 12, in which a charging capacitor 14 coupled to an integrating node 16 is charged by a current supplying circuit 15. A comparator 18 is coupled to the integrating node 16. When the integrated voltage at the integrating node reaches a threshold, the detector passes a signal, such as a wake-up signal, to further circuits 19. An unwanted short pulse has no effect because, although the start of such a short pulse starts integration, a reset occurs before the integrated voltage can reach the threshold.

In a timer circuit the signal at input connection 10 is not directly passively filtered to suppress short duration pulses. Instead transitions in the signal at the input connection are used to start and reset integration. The integration speed itself is determined substantially independently of any current to the input connection by the capacitance value of the charging capacitor 14 and the current supplying circuit. As a result, a much smaller capacitor 14 can be used in the integrating circuit than in a passive linear low-pass filter.

The function of starting and resetting integration is usually implemented by arranging the main current channel of a switching transistor 11 in parallel with the charging capacitor 14, and applying a signal derived from the input connection of the integrated circuit device to the control electrode of the switching transistor so as to discharge the charging capacitor 14 outside the pulses.

However, such an implementation of the start and reset function has turned out to be vulnerable in hostile environments, such as automotive environments. When the duration of unwanted pulses approaches the delay of the switching transistor 11 it becomes possible that integration continues in spite of the short duration of the unwanted pulses, because the switching transistor 11 does not become properly conductive. Similarly, parasitic capacitances in the switching transistor 11 may lead to unwanted integration effects.

Among others, it is an object of the invention to provide an integrated circuit device with a connection for an external conductor that permits detection of signals from the conductor, while effectively suppressing unwanted signals without using large capacitors for passive low-pass filter purposes.

The invention provides an integrated circuit according to claim 1. The integrated circuit device according to the invention uses a timer circuit to eliminate unwanted pulses of short duration. According to the invention a diode is used between the input connection of the integrating circuit and the integration node of the timer circuit, so that the diode serves to reset integration at the end of a pulse that has a polarity that would normally lead to passing of a pulse detection signal from the comparator, if the pulse is sufficiently long. By using a diode for this purpose, the problems associated with a reset transistor are avoided. A diode provides a maximum speed reset with reduced susceptibility to disturbance by unwanted pulses. To achieve optimum speed, preferably no resistance is included in series with the diode between the input connection and the integration node, or a resistance is included that does not reduce the speed of discharge of the charging capacitor to substantially below the speed of the detector circuit.

In an embodiment, a first and a second integrating circuit for integration with mutually opposite integration polarity are included, each containing a diode that serves to reset integration, the diodes in the integrating circuits being coupled with mutually opposite polarity. First and second detectors of the integrating circuits are coupled to a memory element that is set to a first state after detection integration of the first integrating circuit crosses a first threshold and to a second stage after detection integration of the first integrating circuit crosses a second threshold. Thus, short unwanted pulses where the signal goes low as well as short unwanted pulses where the signal goes high are eliminated.

Preferably, the thresholds are offset at least two diode voltage with respect to one another, so that conflicts between the detectors are excluded.

Preferably a switchable current source is provided, having a current output coupled to the input connection, for forward biasing the diode, the switchable current source having a switching control input coupled to the state holding circuit for switching the switchable current source off when the state holding circuit is set to the first state and switching it on when the state holding circuit is set to the second state. The switchable current source provides for a time selective threshold against detection of weak pulses of one polarity when the circuit is receptive for detecting pulses of that polarity. Preferably, two current sources of opposite polarity are provided in this way for providing mutually opposite thresholds when the state holding circuit is in the first and the second state, respectively.

The circuit is particularly useful in an automotive environment (for example in the electronics system of a car) since it has been found that integrated circuits often disfunction in such an environment due to unwanted signal pulses.

Preferably, a wake-up input connection of an integrated circuit is provided with a circuit as described above. A wake-up input is used to switch an electronic circuit from a "sleep" state in which many parts of the circuit are disabled to reduce power consumption to a normal operating state where these parts are enabled. Wake-up signals often come from remote locations and therefore wake-up inputs often have to be connected to long conductors, which makes protection against unwanted pulses especially advantageous.

Figure 1:
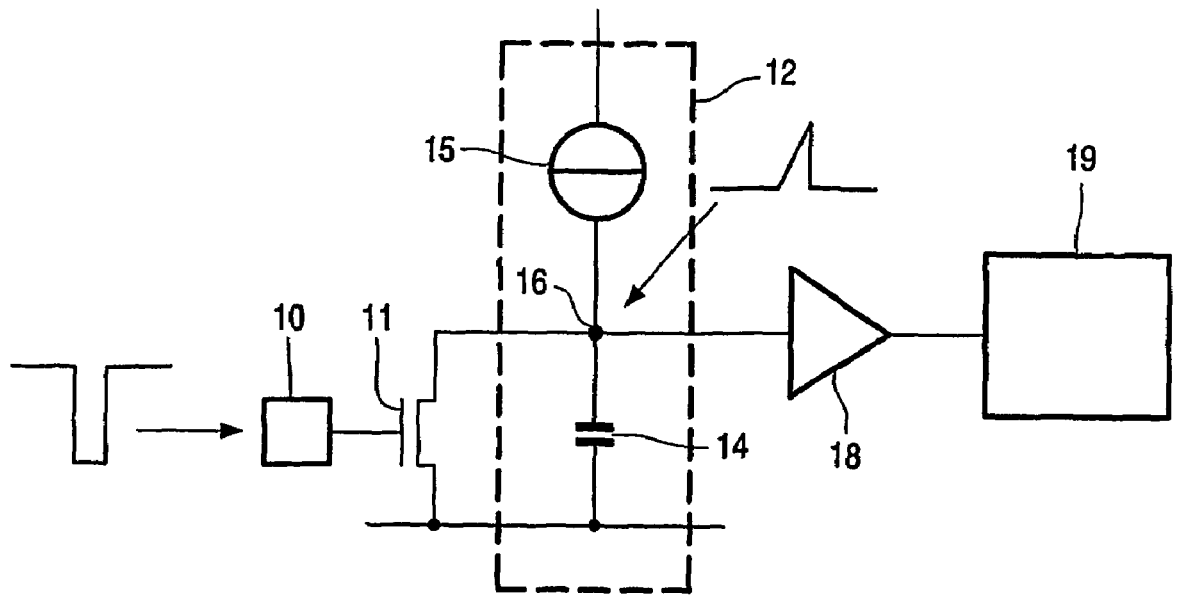
FIG. 1 shows a prior art integrating circuit connected to an input connection.
Figure 2:
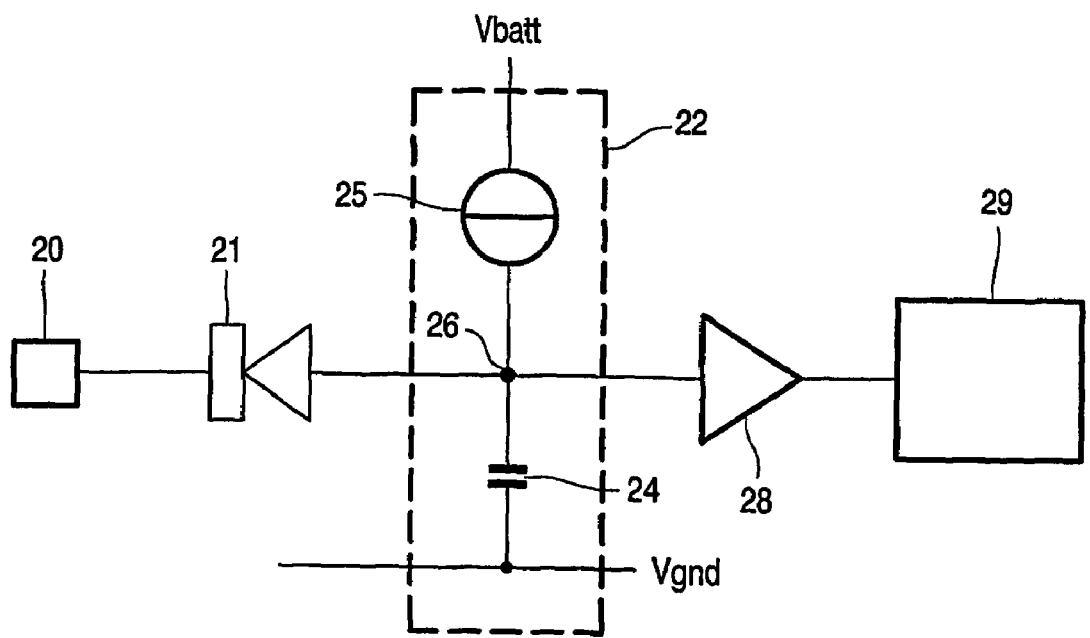
FIG. 2 shows a circuit with an input protection circuit.

FIG. 2 shows a circuit with an input protection circuit. The circuit is integrated in an integrated circuit device, typically a semiconductor integrated circuit device. The circuit contains an input connection 20 of the integrated circuit device, such as a bond pad, for connection of an external conductor. The circuit furthermore contains a diode 21, a detector circuit, further circuits 29 and an integrating circuit 22 with a charging capacitor 24, a current source circuit 25 and a changing node 26. Input connection 20 is coupled to charging node 26 via diode 21, diode 21 being arranged with a polarity such that it is able to drain current from current source circuit 25 in a forward direction. Charging node 26 is coupled to a first power supply line Vgnd via charging capacitor 24 and to a second power supply line Vbatt via current source circuit 25. Charging node 26 is coupled to an input of detector 28, which has an output coupled to further circuits 29. Charging capacitor 24 should withstand the voltages that are present on node 20; for higher voltages this may be realized by using a pair of conductive planes in the interconnect wiring of the integrated circuit device, which are separated by a dielectric layer. Charging capacitor 24 has a capacitance of around 1 pF for example. Diode 31 may be implemented for example as a lateral diode in a semiconducting layer of the integrated circuit device.

Figure 3:
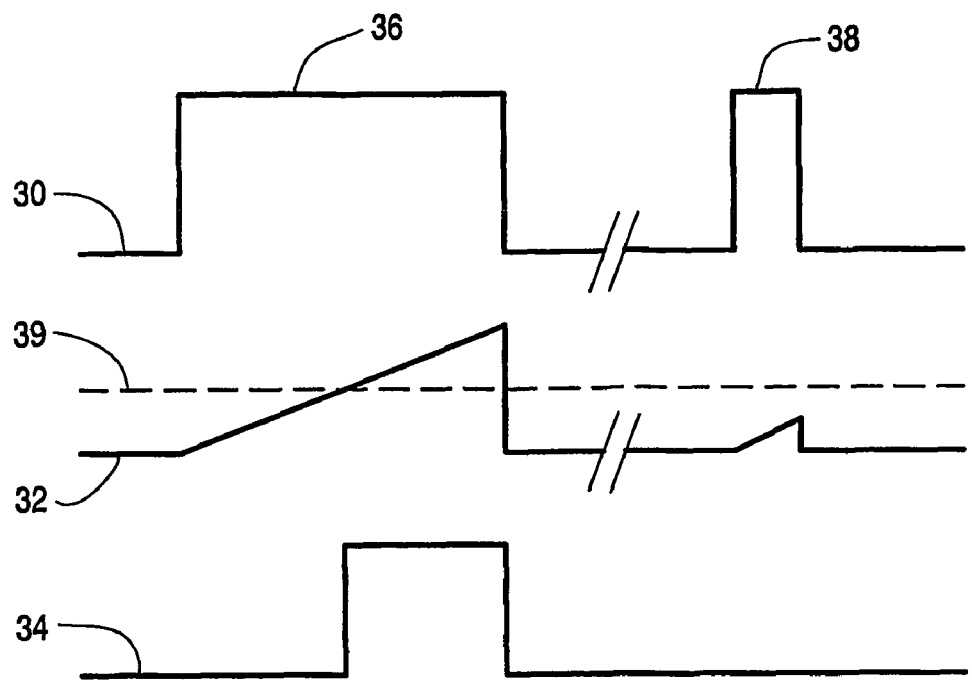
FIG. 3 shows signals that occur in the circuit of FIG. 2.

FIG. 3 illustrates the operation of the circuit of FIG. 2. FIG. 3 shows an input signal 30 at input connection 20, an integrated voltage 32 at charging node 26, and an output signal at the output of detector 28. Input signal 30 initially has a low voltage, but the voltage rises to a higher level during a relatively long pulse 36. Later, input signal 30 again rises, but only for a relatively short pulse 38. As long as input signal 30 has a low voltage, diode 21 keeps charging capacitor 24 discharged.

When the voltage of input signal 30 rises during a pulse 36, 38, a current I from current source circuit 25 starts charging capacitor 24 so that the voltage Vn 32 at charging node 26 starts rising according to $dVn/dt=I/C$, where C is the capacitance value of charging capacitor 24. When input signal 30 drops back again, the charging current is deviated from charging capacitor 24 and charging capacitor 24 is discharged.

Detector 28 generates a signal transition at its output when its input voltage (integrated voltage 32) crosses a threshold voltage level 39. During a relatively long pulse 36, integrated voltage 32 continues to rise until it reaches threshold voltage level 39. Accordingly detector 28 generates a signal indicating detection of the pulse. After a relatively short pulse 38, charging capacitor 24 is discharged before integrated voltage 32 rises to threshold voltage level 39. As a result, detector 28 produces no detection signal and further circuits 29 are not informed of relatively short pulse 38.

Further circuits 29 are arranged to respond to the detection signal that detector 28 generates when integrated voltage 32 rises over threshold voltage level 39. This does not occur when a pulse 38 at input connection 20 is relatively short. The critical length of the pulse is determined by threshold voltage level 39 and the integration speed (which depends on the current from current source 25 and the capacitance value of capacitor 24). Currents through diode 21 do not substantially affect this critical length: diode 21 only provides for a reset of the integration when the pulse terminates.

Figure 4:
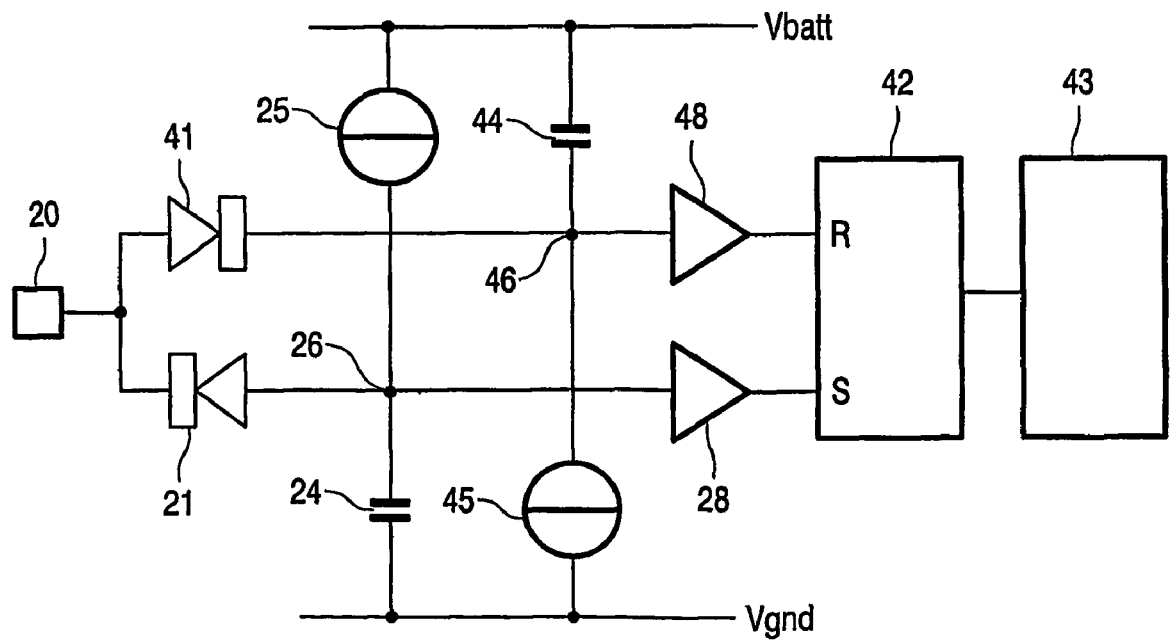
FIG. 4 shows a two way input protection circuit.

FIG. 4 shows a two-way protection circuit. In addition to the components shown in FIG. 3, the circuit contains a further integrating circuit with a further diode 41, a further charging capacitor 44, a further current source circuit 45, a further detector 48 and a further charging node 46. Current source circuit 25 and further current source circuit 45 supply currents to their respective charging nodes 26, 46 in mutually opposite directions. Further diode 41 is coupled between further charging node 46 and input connection 20 with a polarity opposite to that of diode 21, so that further diode 41 is capable of draining current from further current source circuit 45 in the forward direction. A further detector 48 has an input coupled to further charging node 46.

The circuit contains a set/reset flip-flop 42 with a set and a reset input coupled to the outputs of detector 28 and further detector 48 respectively, and an output coupled to further circuits 43, which include a microprocessor for example. Detector 28 and further detector 48 are designed to set and reset flip-flop 42 when the integrated voltage at charging node 26 and further charging node 46 rises above and drops below a threshold level respectively.

In operation, relatively long pulses of the type shown in FIG. 3 cause flip-flop 42 to be reset. Relatively long pulses with opposite polarity (from a high voltage level to a low voltage level and back) cause flip-flop 42 to be set. For each type of pulse, a diode 21, 41 is used to discharge a charging node 26, 46, but with opposite polarity. When the rising integrated voltage at charging node 26 is not reset before it crosses the threshold level of detector 28 flip-flop 42 is set. When the dropping integrated voltage at further charging node 46 is not reset before it crosses the threshold level of further detector 48 flip-flop 42 is reset.

Thus, the state of flip-flop 42 is affected by transitions of two opposite types of polarity at input connection 20, from low to high and from high to low, provided that these transitions are not the leading transition of a pulse with a duration below a threshold duration.

Setting and resetting occur in response to pulses of either type only when the duration of the pulses exceeds critical lengths for the respective type of pulse. The critical lengths of the pulses are determined by threshold voltage levels of detectors 28, 48 and the integration speeds of the integrating circuits (which depend on the current from current source circuits 25, 45 and the capacitance value of capacitors 24, 44). Currents through diodes 21, 41 do not substantially affect this critical length: diodes 21, 41 only provide for a reset of the respective integrations when the pulses terminate.

It will be appreciated that the invention is not limited to the circuit of FIGS. 2 and 4. For example, instead of current source circuits 25, 45 other current supplying circuits may be used, such as resistances, as long as such circuits permit a rising or decreasing voltage to develop when their diode is reverse-biased. Similarly, charging capacitors may be implemented by any circuit with a capacitive effect and with the plate opposite to the charging node connected to any voltage supply. However, preferably conductive (not semi-conductive) plates are used, separated by a layer that can withstand relatively high capacitor voltages, since in a hostile environment signals from input connection 20 may penetrate the capacitors. When current mirrors are used to implement current source circuits 25, 45, these current mirrors preferably have their own input transistors (not shared with other circuits) to prevent unwanted high frequency signals at input connection 20 from affecting such other circuits. Instead of a flip-flop, any circuit may be used that can be set to at least two different states. To achieve optimum speed preferably no resistance is included in series with diode 21 between input connection 20 and integration node 26. However, without detrimental effect a small resistance could be used that does not decrease the speed of discharge of charging capacitor 24 substantially below the speed of detector circuit 28.

Figure 5:
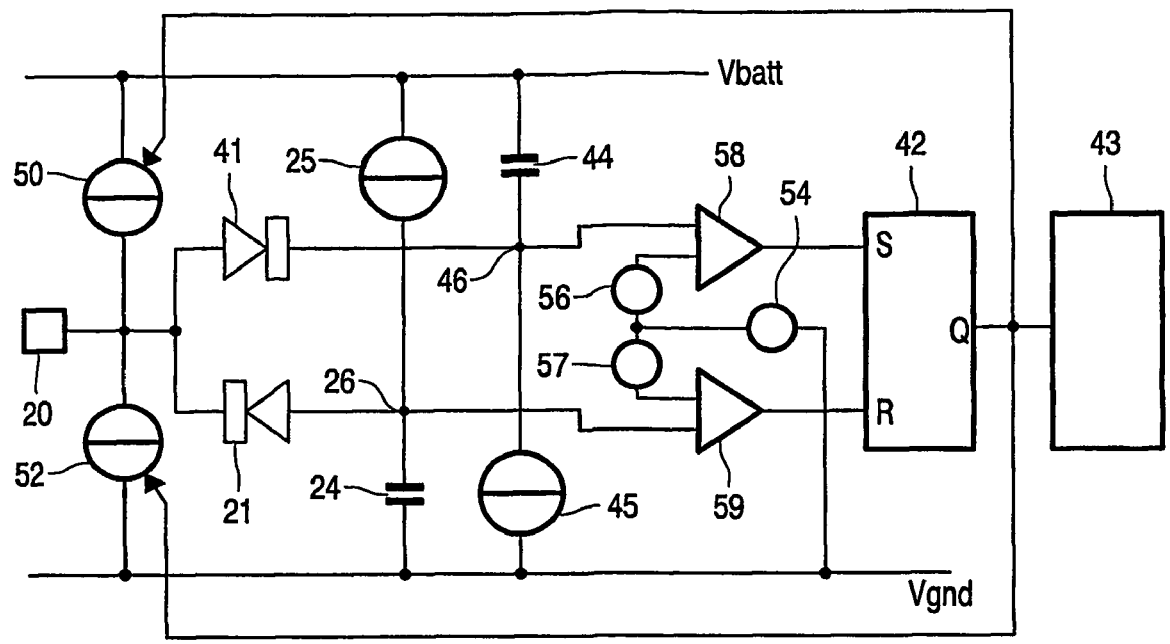
FIG. 5 shows a detailed circuit with an input protection circuit.

FIG. 5 shows a more detailed circuit. In comparison with FIG. 4, controllable current sources 50, 52 have been added between input connection 20 and the different power supply connections Vgnd and Vbatt, respectively. Controllable current sources 50, 52 receive control signals from flip-flop 42. Furthermore, the detectors have been implemented as comparators 58, 59, which provide for different detection thresholds receive (by setting different reference voltages, as symbolized by the use of a common voltage source 54, a threshold raising voltage source 56 for the comparator that detects low to high pulses and a threshold-lowering voltage source 57 for the comparator that detects high to low pulses).

The circuit of FIG. 5 provides for two independent improvements. Controllable current sources 50, 52 provide for a current threshold of pulses at input connection 20. Current thresholds work for both positive and negative pulses because the current source that is connected to the positive power supply is activated when a high level of sufficient duration has been detected, and the current source that is connected to the negative power supply is activated when a low level of sufficient duration has been detected. Thus, disturbing signals of small strength at input connection 20 are not detected. Preferably, controllable current sources 50, 52 are implemented as current mirror circuits. Preferably, these current mirrors have their own input transistors (not shared with other circuits) to prevent unwanted high frequency signals at input connection 20 from affecting such other circuits.

The use of different thresholds for comparators 58, 59 ensures that no conflicting set and reset signals are provided to flip-flop 42, even if slow voltage variations occur at input connection 20. During slow variations, both diodes 21, 41 are forward-biased. The voltage at charging node 26 is one diode voltage drop higher than the voltage at input connection 20 and the voltage at further charging node 46 is one diode voltage drop lower than the voltage at input connection 20. The threshold levels are set so that no simultaneous set and reset occurrences take place, by setting the threshold of the comparator 58 of the further charging node 46 lower than the threshold of the other comparator 59 of the charging node 26 by an amount that is at least equal to the sum of the forward voltage drops over the diodes, typically at least 1.3 Volts in case of silicon diodes. Thus, no simultaneous set and reset occurrences can take place. This maybe realized for example by using diodes to implement offset voltage sources 56, 57.

Figure 6:
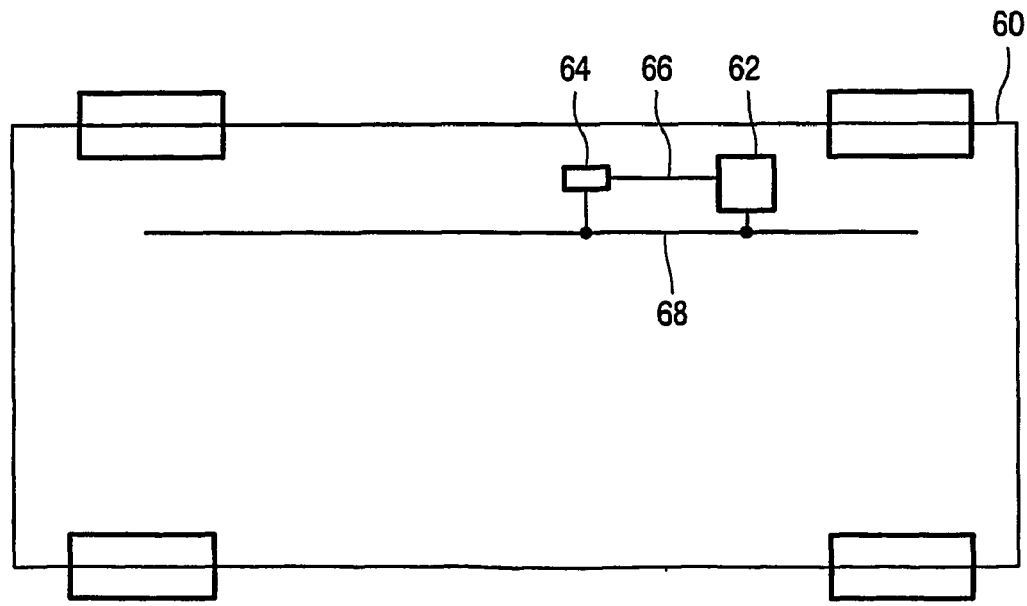
FIG. 6 shows a car with an electronic control system.

FIG. 6 shows a car 60 with an electronic control system. The electronic control system contains a first unit 62 and a second unit 64 coupled via a signal conductor 66. Second unit 64 contains an integrated circuit device of the type shown in FIGS. 2, 3 or 5, with input connection 20 coupled to signal conductor 66. A return circuit (ground) between first unit 62 and second unit 64 is realized via a common conductor 68, which also provides the return circuit of other circuits (not shown), for example via the chassis of car 60.

First unit 62 is for example a switch for applying a signal to a microprocessor in the integrated circuit device in second unit 64, for example to control a motor to open a window. The first unit 62 is remote from the second unit 64, so that the signal conductor spans a much larger distance than the internal size of the units. In this environment, signals at the second unit may contain strong unwanted signals with high frequency content, due to currents from other circuits (not shown) on common conductor 68 or pick-up by signal conductor 66. By using the circuits shown, the risk of malfunctioning of the integrated circuit device due to these unwanted signals can be reduced.

The invention claimed is:

1. An integrated circuit device comprising:
   an input connection for connecting an external signal conductor;
   a timer circuit comprising a capacitance and a current supplying circuit coupled to an integration node;
   a discharge diode coupled between the input connection and the integration node, with a polarity such that the discharge diode, when in forward bias, is capable of draining current from the current supplying circuit;
   a detector coupled to the integration node for generating a signal to be supplied to the integrated circuit device to respond to a signal transition on the conductor when a voltage of the integration node passes a threshold value due to integration of a current supplied by the current supplying circuit when the discharge diode is in reverse bias;
   a further timer circuit comprising a further capacitance and a further current supplying circuit coupled to a further integration node for charging the further integration node in a direction opposite to the direction of charging of the integration node by the current supplying circuit; a further discharge diode coupled between the input connection and the farther integration node, with a polarity such that the further discharge diode, when in forward bias, is capable of draining current from the further current supplying circuit; a further detector with an input coupled to the further integration node; and a state holding circuit, coupled to the detector and the further detector, so that the state hold in circuit is set to a first and a second state by the detector and the further detector respectively in response to signal transitions on the conductor, when a voltage of the integration node and the further integration node pass a threshold value and a further threshold value due to integration of a current supplied by the current supplying circuit or the further current supplying circuit when the discharge diode or the further discharge diode respectively is in reverse bias.

2. An integrated circuit device according to claim 1, comprising a switchable current source having a current output coupled to the input connection for forward biasing the diode, the switchable current source having a switching control input coupled to the state holding circuit for switching off the switchable current source when the state holding circuit is set to the first state and switching it on when the state holding circuit is set to the second state.

3. An integrated circuit device according to claim 1, wherein the detector and the further detector have mutually offset threshold levels, so that no update of the state holding circuit occurs when a difference between voltages at the charging node and the further charging node is less than a sum of forward biased diode voltages of the discharge diodes seen between the charging node and the further charging node.

4. An integrated circuit device according to claim 1, wherein an output of the detector is coupled to a wake-up input of a data processing circuit in the integrated circuit device.

5. An integrated circuit device according to claim 1, wherein a state signaling output of the state holding circuit is coupled to a wake-up input of a data processing circuit in the integrated circuit device.

6. Electronic control system of a car, comprising a signal conductor between substantially different locations in the car, and an integrated circuit device according to claim 1 with its input connection coupled to the signal conductor.

* * * * *